(12) United States Patent
Norga et al.

(10) Patent No.: US 6,545,856 B1
(45) Date of Patent: Apr. 8, 2003

(54) METHOD OF FABRICATION OF A FERRO-ELECTRIC CAPACITOR AND METHOD OF GROWING A PZT LAYER ON A SUBSTRATE

(75) Inventors: Gerd Norga, Antwerp (BE); Dirk Wouters, Leuven (BE)

(73) Assignee: Interuniversitair Microelectronica Centrum (IMEC), Leuven (BE)

( * ) Notice: Subject to any disclaimer, the term of this patent is extended or adjusted under 35 U.S.C. 154(b) by 0 days.

(21) Appl. No.: 09/857,320

(22) PCT Filed: Nov. 30, 1999

(86) PCT No.: PCT/BE99/00155

§ 371 (c)(1),
(2), (4) Date: Aug. 31, 2001

(87) PCT Pub. No.: WO00/33361

PCT Pub. Date: Jun. 8, 2000

Related U.S. Application Data

(60) Provisional application No. 60/110,276, filed on Nov. 30, 1998.

(30) Foreign Application Priority Data

Oct. 26, 1999 (EP) .............................................. 99870224

(51) Int. Cl.$^7$ .................................................. H01G 4/06
(52) U.S. Cl. ....................... 361/311; 361/303; 361/305; 257/295; 257/296
(58) Field of Search ................................ 361/303, 305, 361/311, 306.3; 257/295, 296, 303, 306

(56) References Cited

U.S. PATENT DOCUMENTS

| | | | | |
|---|---|---|---|---|
| 5,234,641 A | * | 8/1993 | Rutt | 156/89.12 |
| 5,572,052 A | * | 11/1996 | Kashihara et al. | 257/295 |
| 6,303,490 B1 | * | 10/2001 | Jeng | 438/627 |

\* cited by examiner

*Primary Examiner*—Anthony Dinkins
(74) *Attorney, Agent, or Firm*—Knobbe, Martens, Olson & Bear LLP

(57) ABSTRACT

The present invention is related to a method, wherein a PZT layer includes a first PZT sub-layer and a second PZT sub-layer, the Ti-concentration of the first PZT sub-layer being higher than the Ti-concentration of the second PZT sub-layer.

15 Claims, 8 Drawing Sheets

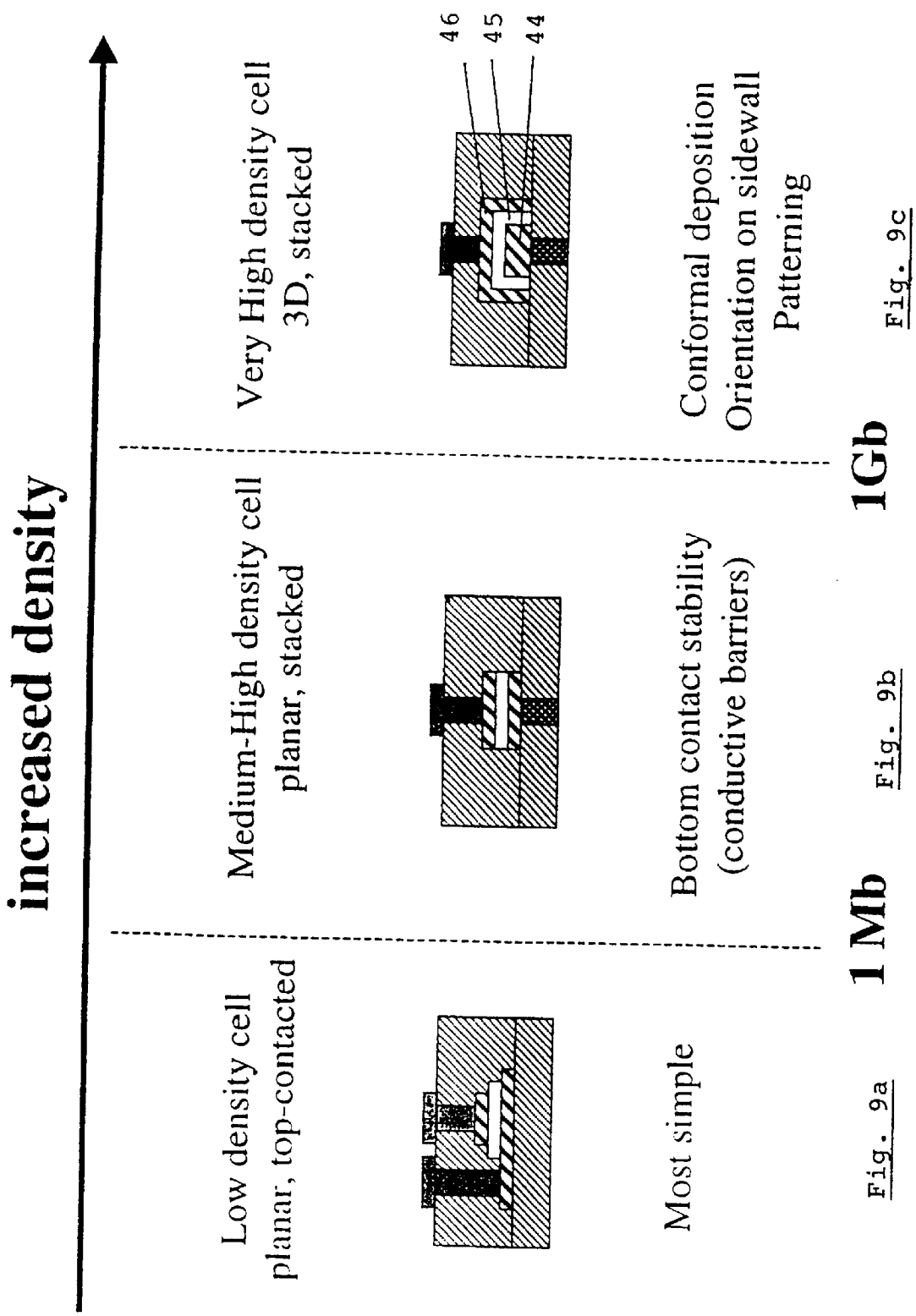

METHOD OF FABRICATION OF A FERRO-ELECTRIC CAPACITOR AND METHOD OF GROWING A PZT LAYER ON A SUBSTRATE

This application claims priority under 35 U.S.C. § 119 to U.S. Provisional Application No. 60/110,276 filed on Nov. 30, 1998, and to European Patent Application No. 99870224.5 filed on Oct. 26, 1999.

FIELD OF THE INVENTION

The present invention is related to a method of fabrication of a ferro-electric capacitor.

The present invention is also related to a method of growing a PZT layer on a substrate.

The present invention is also related to a ferro-electric capacitor.

The present invention is related to a 3D-capacitor.

BACKGROUND OF THE PRESENT INVENTION

There is a development in the art of non-volatile memories based on ferro-electric capacitors (FERAM-structure). In this development PZT films are an important candidate material. Such PZT films are ferro-electric layers comprising at least platinum, zirconium and titanium. Usually they are in the form of: $Pb(Zr, Ti) O_3$ or $(PbX) (Zr TiY) O_3$ where X=La and Y=Ta, are in small concentration as dopants.

A ferro-electric PZT based capacitor is formed by sandwiching a PZT layer between a first and a second electrode, the first electrode being a bottom electrode, the second electrode being a top electrode.

The principal advantage of PZT materials is their relatively low (500–600° C.) crystallisation temperatures which are compatible with a base line CMOS process and their high remanent polarisation.

As the deposition of a PZT layer directly on a bottom electrode such as a Pt-layer leads to poor fatigue performance of the capacitor, it was suggested to have a conductive oxide layer first deposited on the Pt-layer before the deposition of the PZT layer. This conductive oxide can be a unary oxide having a rutile crystal structure such as $IrO_2$, $RuO_2$ or $OsO_2$ or a complex oxide having a perovskite structure such as $(La,Sr)CoO_3$.

For the synthesis of ferroelectric PZT layers, use is often made of a two-step process:
 an amorphous layer is deposited, for instance by sol-gel or CVD or related techniques,
 this amorphous layer is converted into a ferro-electric layer having a perovskite crystal structure by a thermal treatment (crystallisation).

While the growth of oriented PZT layers is in principal facilitated by the use of perovskite electrodes, unary oxides are in practice preferred because they are readily synthesised by reactive sputtering. $RuO_2$ has received the most attention in this respect because of its relatively low resistivity (50 $\mu\Omega$cm, the lowest of the rutile type oxides), excellent diffusion barrier properties, and proven compatibility with silicon technology.

In order to obtain PZT ferro-electric layers showing high quality hysteresis loops and ferro-electric switching properties, it may be advantageous to achieve a strongly preferential (111) orientation of the grains making up the PZT layer.

This goal can be achieved by using a template layer having a (111) orientation such as a sputtered Pt layer with the (111) orientation.

In order to achieve the desired (111) orientation in the PZT layer, a conductive oxide is commonly grown under conditions so as to obtain a columnar microstructure on top of the so-called template layer which has the property that it can be deposited with a strongly preferred orientation. In this type of microstructure there is a fixed orientational relationship between the grains of the Pt layer and the grains of the conductive oxide layer.

So in other words such conductive oxide layer with a columnar microstructure can transmit the orientation of the underlying Pt layer to thereby assure that the PZT layer formed on this conductive oxide layer will have, after crystallisation, the same orientation as the underlying PT layer. Because the grains of the Pt are strongly preferentially (111) oriented, this means that the grains of the conductive oxide layer will be preferentially oriented as well. Because the grains of the PZT layer grown subsequently will again tend to have a fixed orientational relationship with the conductive oxide, it is possible in this way to grow highly oriented PZT layers having a (111) orientation.

However, this conventional approach described here above has several drawbacks.

Firstly, the need to make use of a template layer such as Pt represents a considerable process complication. However the template layer is needed because without it, the conductive oxide has the property to grow with random or mixed structure.

Secondly, the columnar structure of both the first layer, i.e. the template layer and the second layer, i.e. the conductive oxide layer leads to inferior diffusion barrier properties of these layers. These diffusion barrier properties are necessary to protect the layers lying under the PZT layers against the indiffusion of oxygen during the growth of the PZT layer. This is of particular importance in a configuration where the bottom electrode of the capacitor is formed on a via connection, connecting said bottom electrode with the terminal of an active device, e.g. a MOSFET. This outdiffusion of oxygen can lead to a degradation of the electrical properties, particularly the conductivity, of this via connection.

Thirdly, the growth of a PZT layer on a bottom electrode with a columnar structure can have, depending on the application, a further disadvantage as it leads to PZT layers with small grain sizes, typically 100 to 200 nm lateral dimension. This small grain size is the result of the high nucleation rate of PZT on columnar layers during the crystallisation treatment. This high nucleation rate is due to the large surface roughness of columnar layers. This surface roughness is caused by the grains of the conductive oxide, which have the tendency to form facets. These facets form fixed angles with respect to the growth direction. Due to this effect, layers with smaller grains have a lower surface roughness. A higher surface roughness makes the formation of a nucleus with the desired crystal structure energetically favourable during crystallisation because the nucleation can take place in a recess at the surface between two adjacent grains thereby minimising the required amount of surface that needs to be created for formation of the nucleus. The small grained PZT layers obtained on columnar electrode layers renders the fabrication of ferro-electric devices on a single PZT grain impossible. Ferro-electric capacitors comprising a PZT layer being composed of a single grain are known to exhibit superior properties such as abrupt ferro-electric switching, low leakage current and high endurance compared to capacitors comprising multiple grains as such multiple grain capacitors incorporate grain boundaries.

Fourthly, fabrication of 3D capacitors using a columnar bottom electrode leads to an undesirable orientation of the PZT grown on the sidewalls. This misorientation implies that the purpose of 3D-capacitor fabrication, namely a gain in the amount of switchable charge per unit area on the wafer, is defeated. To avoid this problem, a new method has to be developed which does not employ the orientation of the bottom electrode grains as a means to control the orientation of the PZT grains.

AIMS OF THE INVENTION

The present invention aims to suggest a method of growing a PZT layer on a bottom electrode and accordingly a method of fabrication of a ferro-electric capacitor which do not have the drawbacks of the state of the art.

MAIN CHARACTERISTICS OF THE PRESENT INVENTION

According to a first aspect, the present invention is related to a method of fabricating a ferro-electric capacitor comprising the steps of:

creating a first electrode consisting essentially in a layer of a conductive oxide on a substrate, forming a ferro-electric PZT layer on said conductive oxide layer, creating a second electrode isolated from said first electrode on the top of the ferro-electric PZT layer, wherein said conductive oxide layer comprises at least two sub-layers of individual grains, the top sub-layer having a random orientation of the individual grains.

Said conductive layer has a micro- or nano-crystalline structure. Preferably the conductive oxide layer has a grain size at least two times and preferably five times smaller than the conductive oxide layer thickness.

According to a first preferred embodiment said conductive layer is made of a unary oxide, preferably having a rutile crystal structure such as $IrO_2$, $RuO_2$, $RhO_2$, $ReO_2$ or $OsO_2$.

According to another preferred embodiment said conductive layer is made of a complex oxide having a perovskite crystal structure such as $(La,Sr)CoO_3$.

According to a preferred embodiment said PZT layer comprises a first PZT sub-layer and a second PZT sub-layer, the Ti-concentration of the first PZT sub-layer being higher than the Ti-concentration of the second PZT sub-layer.

The step of creating a ferro-electric PZT layer consists in:

deposition of an amorphous PZT layer, crystallisation of said amorphous layer into a ferro-electric PZT layer by a thermal treatment.

Advantageously, said PZT-layer will have a (111)-orientation.

According to a preferred embodiment the method further comprises, before creating the first electrode, the steps of:

depositing a contact layer on an active device, depositing a conductive via connection on said contact layer.

Said active device can be a MOSFET.

According to a second aspect, the present invention is related to a method of growing a PZT layer directly on a conductive oxide layer formed on a substrate, wherein said conductive layer comprises at least two sub-layers of individual grains, the top sub-layer having a random orientation of individual grains.

During the growing of the conductive oxide layer, said substrate has a temperature comprised between a first predetermined temperature Tc1 and a second predetermined temperature Tc2, Tc1 being defined by the temperature below which the sub-layers of the conductive oxide layer being amorphous, Tc2 being defined by the temperature which ensures that the grain size of the conductive oxide layer does not exceed a predetermined dimension, preferably of the order of several nanometers and typically of the order of 20 nm.

The atmosphere during the growing of the PZT layer is preferably a $O_2$/Ar mixing atmosphere having a ratio above 1 and preferably above 4/1.

The deposition rate during the growing of the conductive oxide layer is comprised in the range 15–20 nm/min.

Preferably said conductive oxide layer has a grain size at least two times and preferably five times smaller than the PZT layer thickness.

As a third aspect, the present invention is related to a ferro-electric capacitor comprising at least:

a first electrode, a second electrode being isolated from said first electrode, a ferro-electric PZT layer being sandwiched between said first electrode and said second electrode, wherein said first electrode comprises at least a layer of conductive oxide having at least two sub-layers of individual grains, the top sub-layer showing a random orientation of individual grains and a nano-crystalline structure, with preferably a grain size <20 nm.

According to a first preferred embodiment said conductive layer is made of a unary oxide, preferably having a rutile crystal structure such as $IrO_2$, $RuO_2$, $RhO_2$, $ReO_2$ or $O_sO_2$.

According to another preferred embodiment said conductive layer is made of a complex oxide having a perovskite crystal structure such as $(La,Sr)CoO_3$.

Advantageously, said conductive oxide layer will have a (111) orientation.

According to a preferred embodiment said PZT layer comprises a first PZT sub-layer and a second PZT sub-layer, the Ti-concentration of the first PZT sub-layer being higher than the Ti-concentration of the second PZT sub-layer.

According to a fourth aspect, the present invention is related to a 3-dimensional ferro-electric capacitor comprising a first electrode, a second electrode being isolated from said first electrode, a ferro-electric PZT layer being sandwiched between said first electrode and said second electrode wherein said PZT layer has the form of one horizontal surface and two sidewalls overlapping said first electrode, wherein said first electrode comprises at least a layer of a conductive oxide having at least two sub-layers of individual grains, the top sub-layer showing a random orientation of individual grains, preferably with a grain size <20 nm.

SHORT DESCRIPTION OF THE DRAWINGS

FIGS. 4a and 4b are representing the hysteresis measurements for a capacitor having a $RuO_2$ bottom electrode layer, grown at 350° C. wherein FIG. 5a is showing the nested loops from 1 to 7 V with 1 V steps and FIG. 5b is representing the remanent polarisation ($P_r$) and saturation polarisation ($P_{sat}$) versus the voltage.

FIGS. 5a and 5b are representing the hysteresis measurements for a capacitor having a RuO$_2$ bottom electrode layer, grown at 150° C. wherein FIG. 6a is showing the nested loops from 1 to 7 V with 1 V steps and FIG. 5b is representing the remanent polarisation (P$_r$) and saturation polarisation (P$_{sat}$) versus the voltage.

Figure 6:
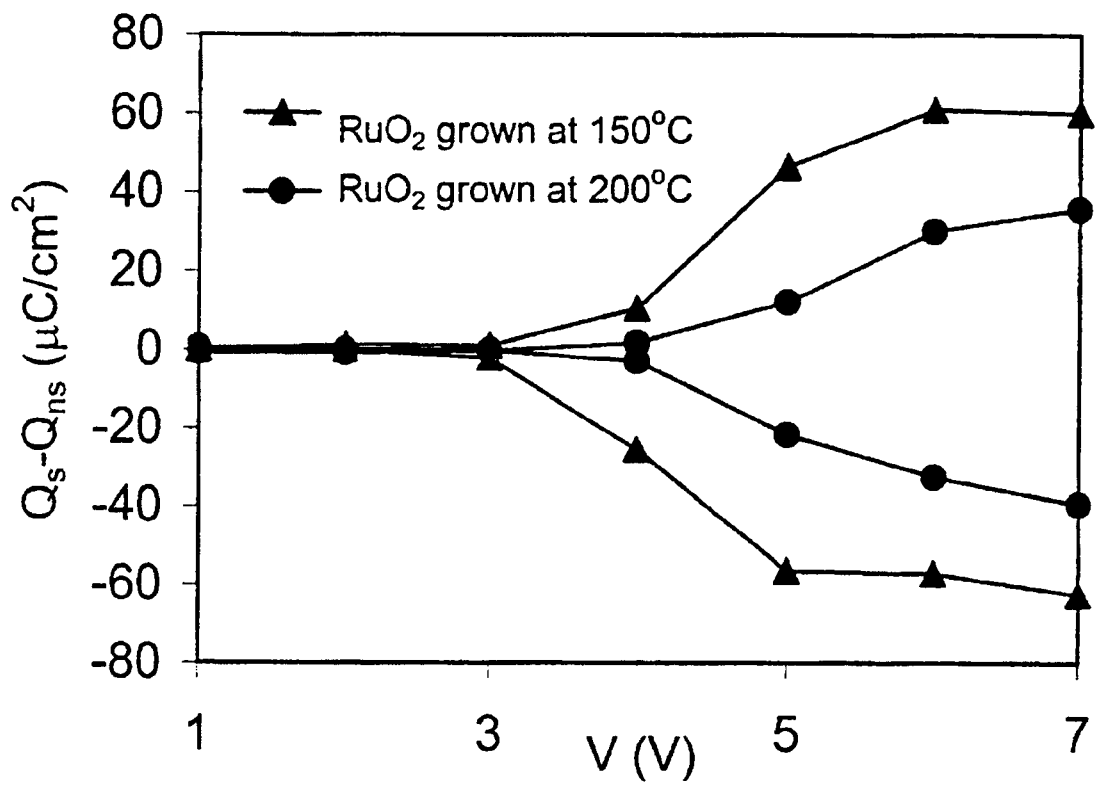

FIG. 6 is representing the pulse switching results for a sample with a RuO$_2$ bottom electrode layer, grown at 150 and 200° C.

Figure 7:
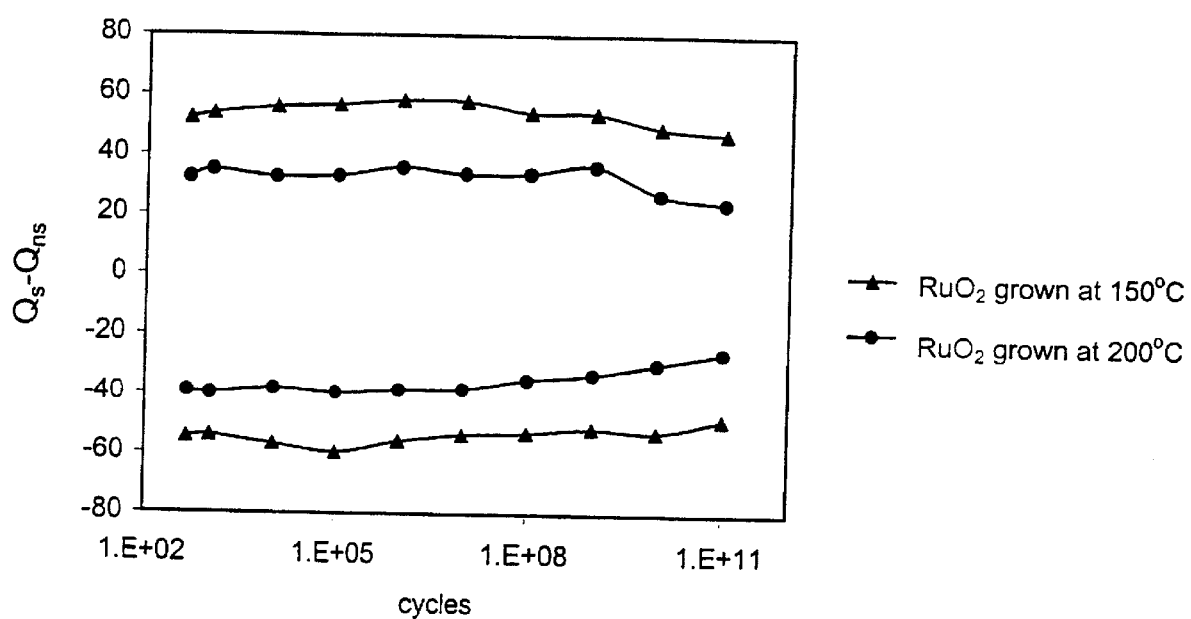

FIG. 7 is representing the fatigue result for a sample with RuO$_2$ bottom electrode layer, grown at 150 and 200° C.

Figure 8A:
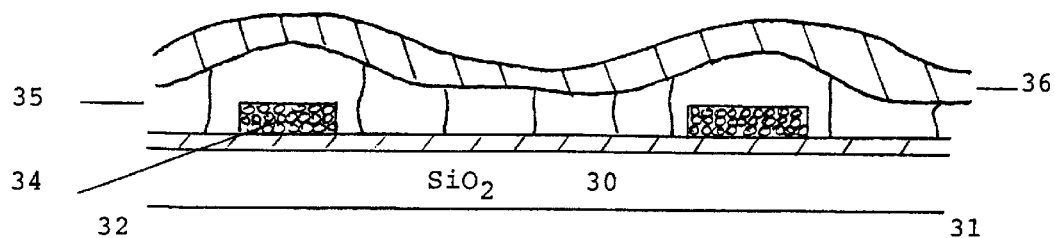
Figure 8B:
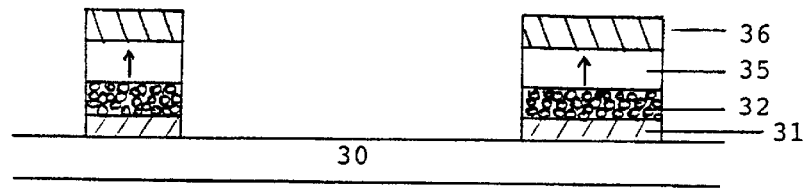
Figure 8C:
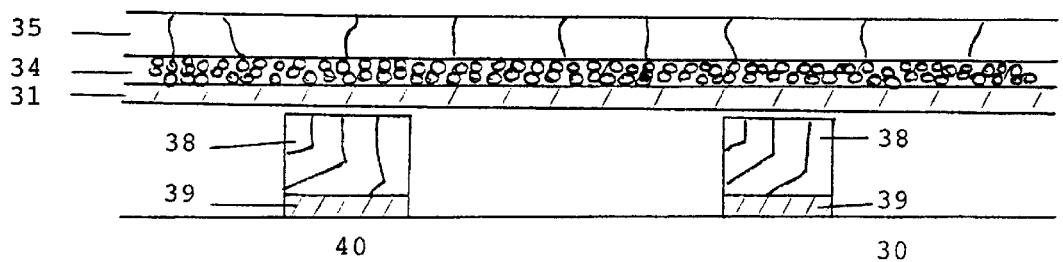

FIGS. 8a–8c are representing several embodiments of a ferro-electric capacitor fabricated according to the method of the present invention.

FIGS. (9a–9c) are representing a 3D-capacitor fabricated according to the present invention.

DETAILED DESCRIPTION OF SEVERAL EMBODIMENTS OF THE PRESENT INVENTION

Figure 1:
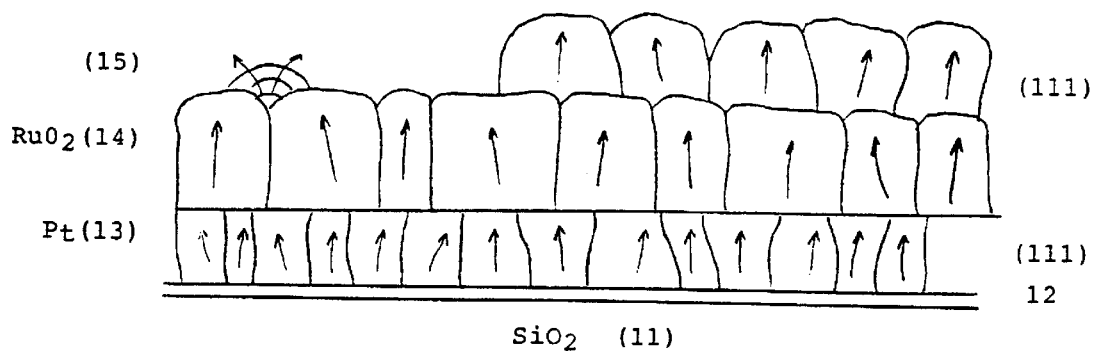
FIG. 1 is representing a method for growing a (111) orientated PZT layer on an arbitrary substrate according to the state of the art.

The present invention will be described more in detail with reference to the several drawings wherein:

FIG. 1 is representing a method for growing a (111) oriented PZT layer on an arbitrary substrate for instance SiO$_2$ according to the state of the art. On said SiO$_2$ substrate (11), a template layer (13) such as a Pt layer is deposited with an adhesion layer (12) there between. Thereafter a conductive oxide layer (14) such as RuO$_2$ is deposited. Said Pt layer (13) has a (111) orientation. Because the grains of the Pt layer (13) are strongly preferentially (111) orientated, the grains of the conductive oxide layer (14) deposited thereon are also preferentially oriented.

The grains of the PZT layer (15) grown subsequently on the conductive oxide layer (14) will also tend to have said preferentially (111) orientation even in the case that the said conductive oxide layer (14) present a preferential (100) orientation. The grains of the PZT layer (15) grown subsequently on said conductive oxide layer (14) will also tend to have the preferential (111) orientation.

Figure 2:
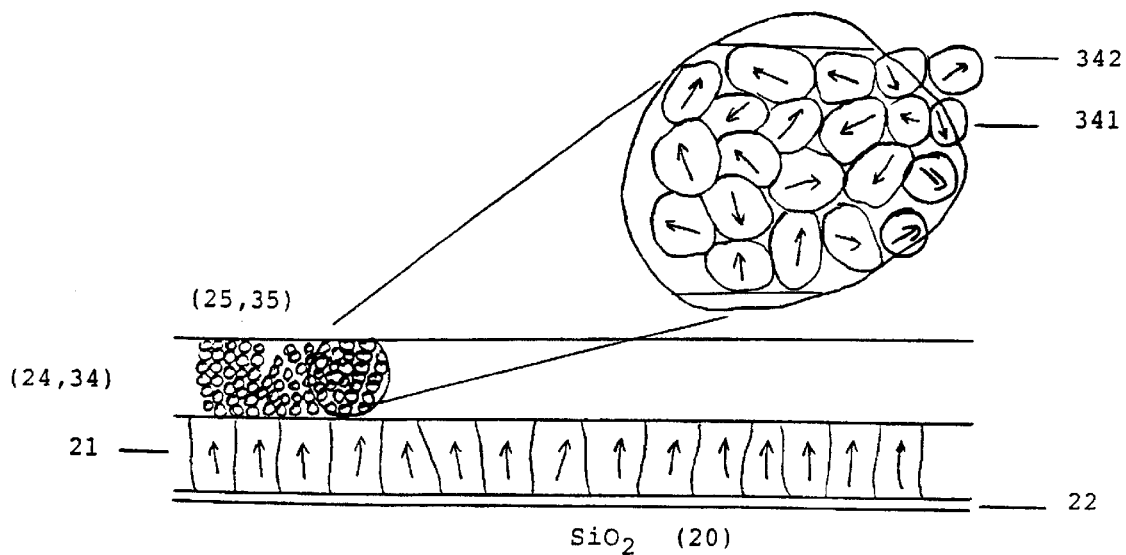
FIG. 2 is describing a method of growing a (111) orientated PZT layer on an arbitrary substrate according to the present invention.

FIG. 2 is representing a method for growing a strongly (111) oriented PZT layer (25) on a conductive oxide layer (24) without the need of a template layer. As represented in said figure, a nano-crystalline conductive oxide layer (24), preferably of the rutile or perovskite structure, which has a grain size of less than 20 nm is used.

The synthesis of PZT films with the desired nano-crystalline microstructure is possible by choosing a specific combination of deposition variables, namely the substrate temperature, the deposition rate, and the Oxygen/Argon mixing ratio in the case of reactive sputtering.

(1) When using sputter deposition with a metallic target, a sufficiently high Oxygen/Argon mixing ratio is needed to ensure full oxidation of the target material, (2) The substrate temperature should be above a minimum temperature Tc1 being defined when the conductive oxide layer is still amorphous. Such amorphous conductive oxide layers are not desired because of their poor stability in ambient air.

(3) The substrate temperature should be low enough (below a critical temperature Tc2) to ensure that the (lateral) grain size of the individual grains does not exceed 20 nm. Above this temperature the enhanced surface diffusivity results in films with coarser grains.

(4) The deposition rate should be sufficiently high (above a critical deposition rate r$_c$) to ensure that a film with a granular rather than a columnar microstructure is formed. Above r$_c$, the arrival rate of sputtered atoms is high enough to ensure nucleation of new grains on top of existing rains during growth of the layer. Because of increasing surface diffusivity, rc increases as the deposition temperature is increased (for the same material).

Because the temperature T$_{c1}$ and T$_{c2}$ scale with the absolute melting temperature, T$_m$, of the metal atoms being sputtered, the specific process window following from the above requirements will vary depending on the type of conductive oxide. Furthermore, T$_{c1}$ and T$_{c2}$ will generally be higher for complex (binary or ternary) oxides with the perovskite structure such as (La,Sr)CoO$_3$ than for unary oxides such as the rutile-structure oxides such as RuO$_2$, IrO$_2$, RhO$_2$, OsO$_2$, ReO$_2$, . . .

For instance, for the case of RuO$_2$ prepared by reactive sputtering, films with the desired nanocrystalline structure can be prepared using substrate temperatures in the range 100–150° C. and corresponding deposition rates r$_c$=15–20 nm/min. When using a metallic Ru target, an O$_2$/Ar mixing ration of 4/1 is needed to ensure full oxidation of Ru to RuO$_2$.

Processing windows for other materials can be calculated based on their absolute melting temperature. For instance, for Osmium (Os), T$_m$(Os)=330° K=1.3×T$_m$(Ru), and hence the deposition window is 215° C.–275° C. for Os, for the same deposition rates.

No fixed orientational relationship exists between the grains of the conductive oxide layer and the grains of the underlying layer (if this underlying layer has at all a preferential orientation). Due to the absence of a preferential orientation in the grains making up the surface of the layer, orientation selection in a PZT layer grown on top of this nano-crystalline conductive oxide layer will occur in a fashion which is distinct from the case of a conductive oxide layer with columnar structure. Instead of growing with a fixed orientational relationship with respect to the grains on which it grows, the PZT will grow with an orientation which minimises the surface energy needed to create a nucleus of crystallisation. For PZT, the orientation corresponding to minimal surface energy is the (111) orientation. For this reason, the orientation of a PZT layer grown on a nano-crystalline or granular conductive oxide layer will be (111), without the need for preferential orientation in the grains making up the top layer of the conductive oxide layer and without the need of template layer. The thermal treatments required for the crystallisation of the PZT layer hardly affect the nano-crystalline structure of the conductive oxide layers.

Since the grains of a nano-crystalline conductive oxide layer are typically 20 nm or smaller, this means several times smaller than the grain size in a columnar layer, the roughness of the granular layer is accordingly smaller than the roughness of the columnar layer. Because of the lower surface roughness of the nano-crystalline conductive oxide, the rate of formation of nuclei of PZT of the desired rutile or perovskite phase will be lower than on the columnar layer. Because the growth rate of the nuclei will not be affected by changes in the roughness of the layers, this will lead to a larger grain size (typically 10 to 100 times larger) in case of a nano-crystalline conductive oxide bottom electrode layer.

Figure 3:
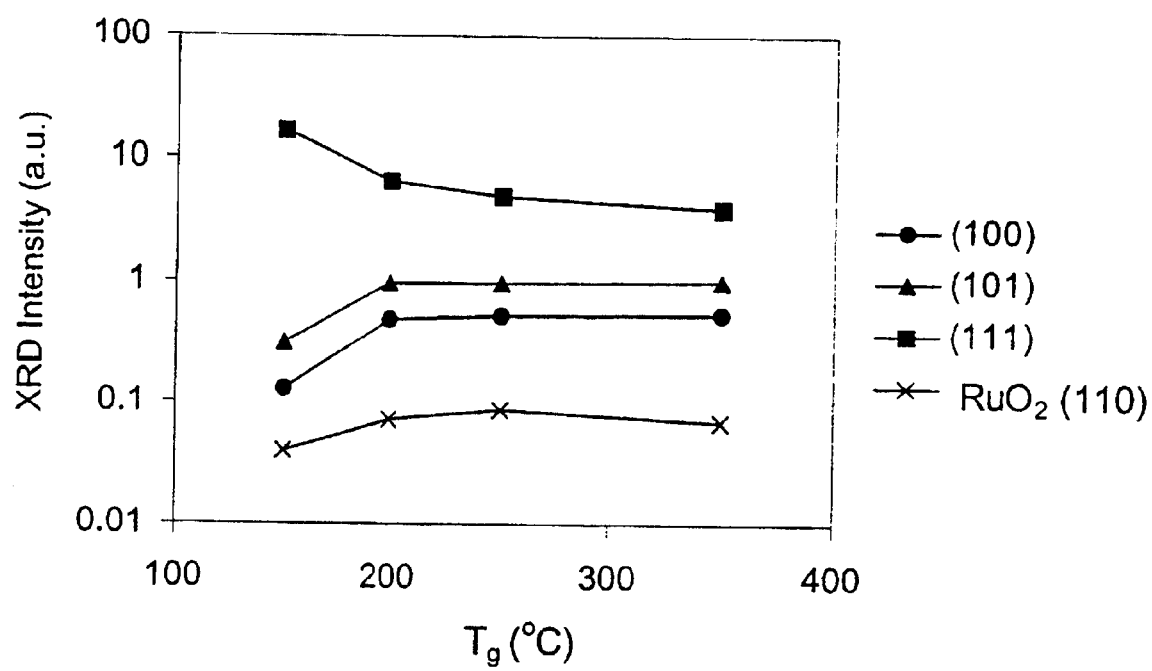
FIG. 3 is representing the effect of a bottom electrode in the present case made of $RuO_2$ growth temperature on the texture of the PZT layer.

FIG. 3 shows the effect of bottom electrode growth temperature on the texture of the PZT grown on top.

For high growth temperatures, where the RuO$_2$ layer has columnar structure, the PZT texture is mixed (111)/(101)/(100). This mixed PZT texture results from a mixed texture of the RuO$_2$. This mixed texture results because of the random texture of the RuO$_2$ layer grown on Pt. As the temperature of the substrate during bottom electrode sputtering is reduced, the grain size of the $RuO_2$ film becomes smaller (which is reflected in the decreasing intensity of the $RuO_2$ (110) peak), and the PZT becomes preferentially (111). The temperature at which the transition to a strongly (111) oriented layer occurs is between 250 and 150° C.; this is also the transition region between $RuO_2$ with columnar and granular structure. However, the value of this critical temperature where the desired transition from columnar to granular conductive oxide material, and hence also from mixed oriented to sharply (111) oriented PZT occurs, may depend considerably on the particular bottom electrode material, on process variables such as the deposition rate, and on the type of layer on which the conductive oxide is grown.

Figure 4:
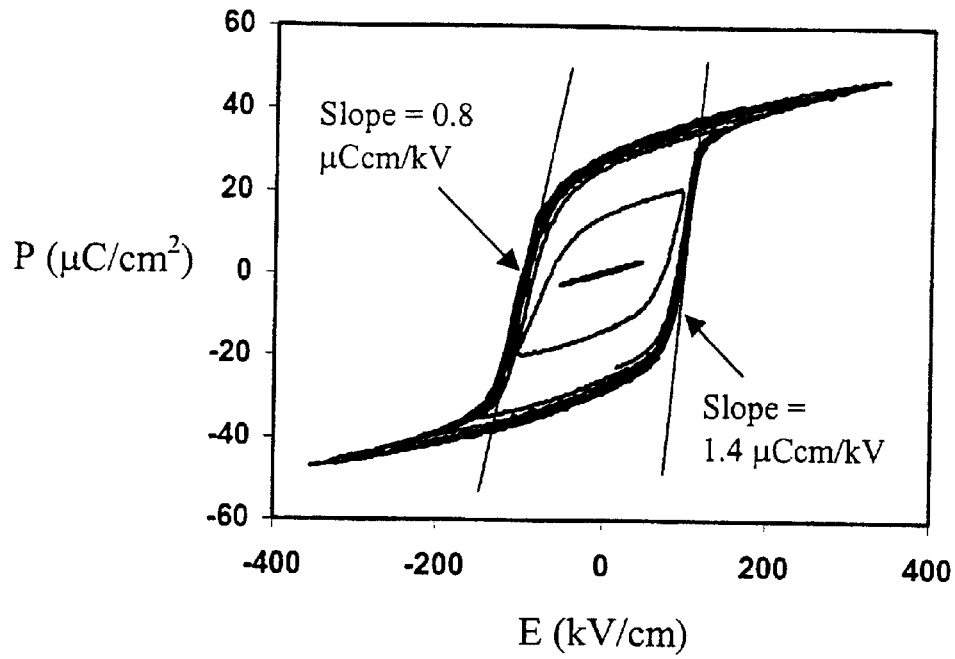
Figure 4:
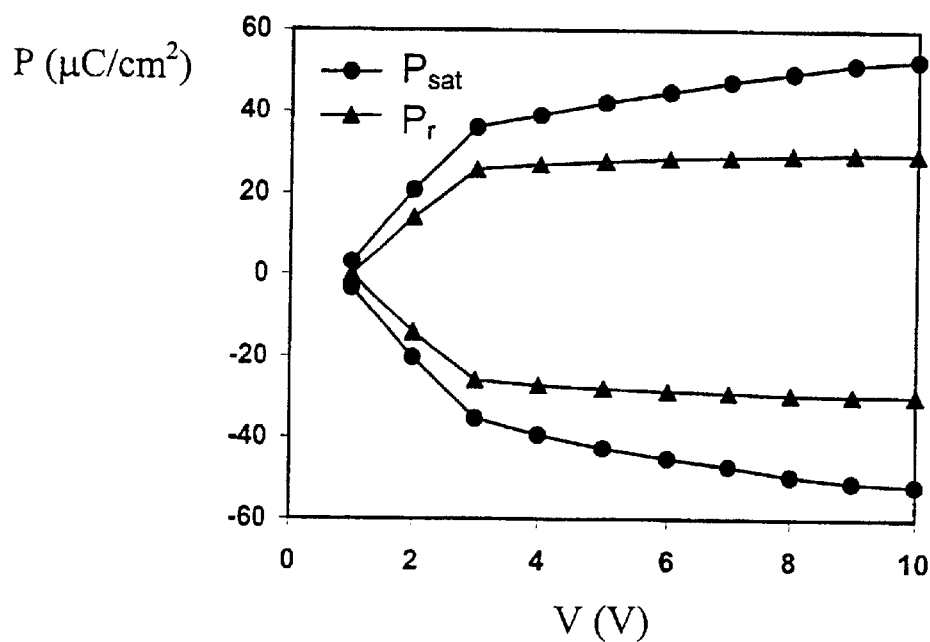
Figure 5:
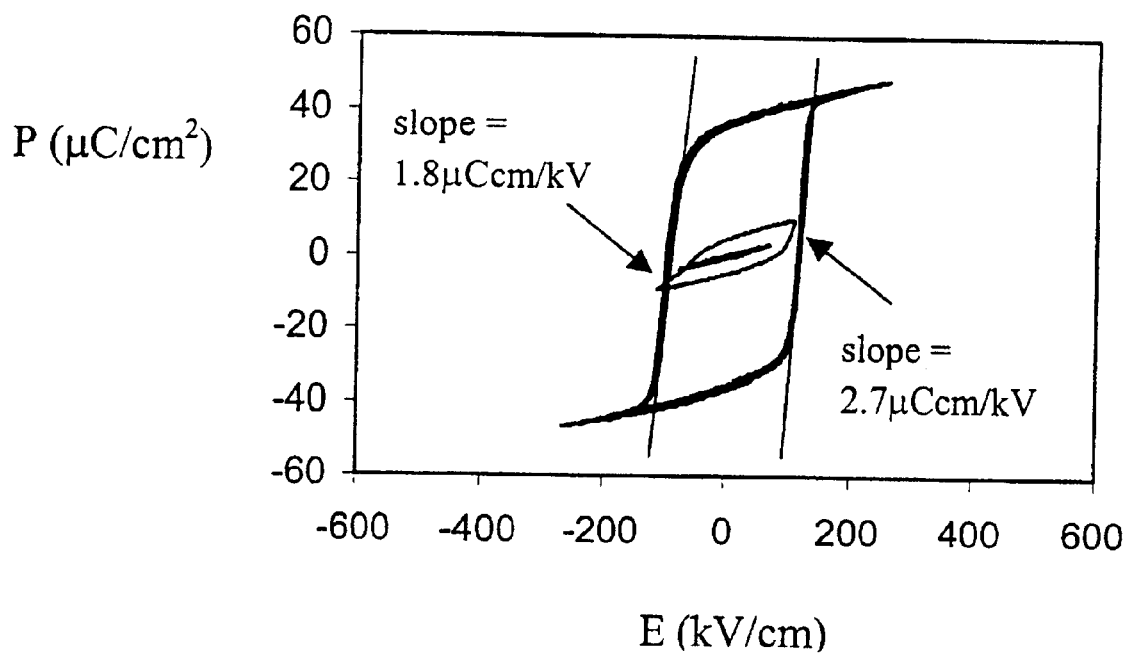
Figure 5:
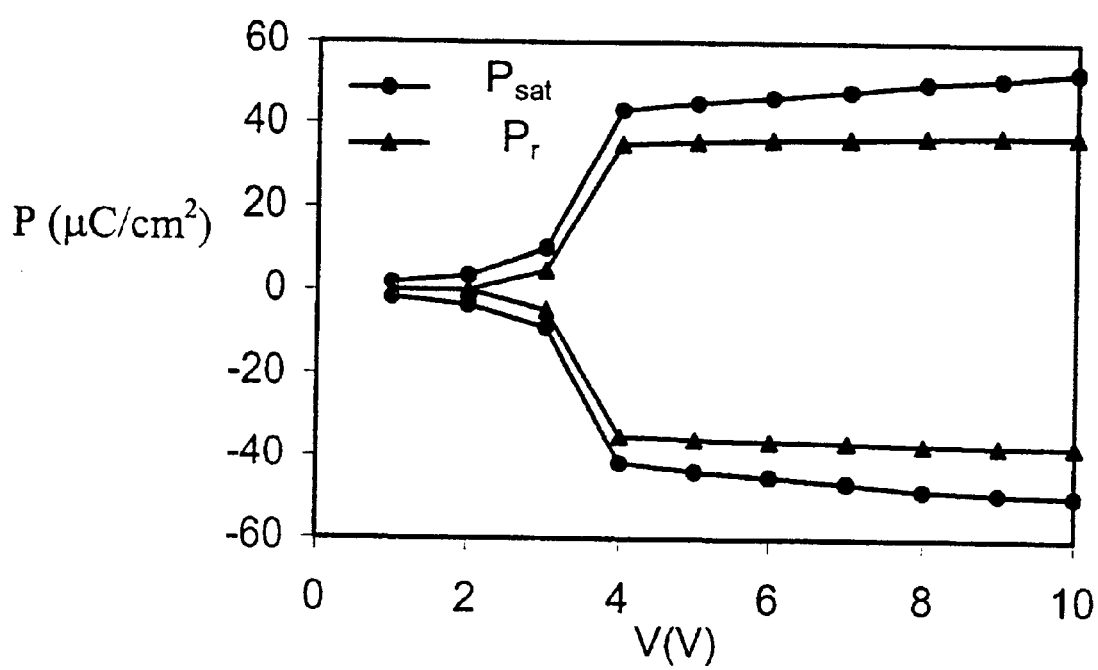

An example of the effect of bottom electrode grain structure on the properties of a ferro-electric capacitor device is shown in FIGS. 4 and 5. Shown in FIG. 4 is the hysteresis characteristic for a randomly textured $RuO_2$ bottom electrode with columnar structure. The bottom electrode was grown at 350° C. The hysteresis loop is slanted, i.e. the slope at the intersection point with the field axis is relatively small. This is indicative of slow switching behaviour which makes the material less suitable for memory circuit applications. The slanting in the loop is due to a mixed texture in the PZT for this growth temperature of the bottom electrode layer.

Shown in FIG. 5 is the hysteresis loop for a $RuO_2$/PZT/$RuO_2$ FECAP where the $RuO_2$ bottom electrode was grown at a low temperature (150° C.) resulting in a granular $RuO_2$ structure.

FIG. 6 compares the pulse switching behaviour for a sample with $RuO_2$ grown at 150 and a sample grown at 200° C. The excellent pulse switching behaviour of the sample with the $RuO_2$ grown at the lowest temperature demonstrates the effect of texture on pulse switching behaviour. Referring back to FIG. 3, we conclude that a very sharp (111) PZT texture ((111)/((101)+(100))>100) is necessary to achieve good pulse switching results.

FIG. 7 demonstrates that the same requirement applies for obtaining optimal fatigue performance of the layers.

These results illustrate the overall improvement in ferro-electric properties, resulting from a highly preferential (111) texture, which can be achieved by using a bottom electrode with a granular structure.

An exemplary embodiment of a ferro-electric capacitor based on the principle described in FIG. 2, is shown in FIGS. 8a and 8b.

In FIG. 8a is represented a ferro-electric capacitor formed by sandwiching a PZT layer (35) between a first and a second electrode, the first electrode being the bottom electrode (34), the second electrode being the top electrode (36).

According to the present invention, said first electrode (34) is made of a conductive oxide layer having a nano-crystalline structure and comprising at least two sub-layers of individual grains, wherein the top-layer has a random orientation of the individual grains. Said conductive oxide layer can be a unary oxide, e.g. $IrO_2$, $RuO_2$, $RhO_2$, $ReO_2$, $OsO_2$ or can be a complex oxide, e.g. $(La,Sr)CoO_3$.

The use of a nano-crystalline conductive oxide layer obviates the need for a template layer with a preferential orientation, such as a Pt layer with the (111) orientation, for the achievement of a preferential (111) orientation in the PZT layer.

This means that a conductive oxide bottom electrode (34) layer with a nano-crystalline structure can be deposited on any arbitrary other underlying layer such as an optional barrier layer (31), without any requirement towards orientation, while still maintaining the desired (111) orientation in the PZT layer (35), grown on top of the conductive oxide layer (34). Thus the new bottom electrode concept leads to less complexity in the processing and more flexibility in the choice of layers forming the bottom electrode stack.

Particularly, in the case as represented in FIG. 8c where a direct contact has to be established between the bottom electrode (34) and a Si substrate or a via connection (38), the new bottom electrode concept is useful because it facilitates the development of the stack of materials which is required to establish a reliable electrical connection between an active device made in the underlying semiconductor substrate and the conductive oxide layer (34), which serves as bottom electrode layer of the ferro-electric capacitor.

Preferably, a conductive via connection (38) connecting said bottom electrode (34) to an electrode or contact layer (39) of an active device (40) is suggested, said device being formed in an underlying semiconductor substrate. Particularly said conductive via connection (39) can be a metal like e.g. Al, Cu, W or an alloy of ans of these materials or even a Poly Si plug. An example of such an active device (40) is a MOSFET.

More precisely, the nano-crystalline conductive oxide layer (34) can be deposited on top of a metal barrier layer (31), e.g. Ir, Ru, Rh, Re, Os which forms a conductive oxide upon oxidation, without any texture requirement for this metal barrier layer. Said metal barrier layer (31) is on its turn deposited on the via connection. Due to the excellent diffusion barrier properties of the nano-crystalline conductive oxide layer, the crystallisation treatment of the PZT formed thereon will not lead to any oxidation or decrease in conductance of the via connection material.

Other diffusion barrier layers can also be used such as Ta- or Ti-based barrier layers, e.g. TaN or TiN, or other Ta- or Ti-based barrier layers such as TiAlN or TaSiN.

According to a preferred embodiment, the PZT layer can comprise at least a first PZT sub-layer and a second PZT sub-layer on said first sub-layer, said first sub-layer being adjacent to the bottom electrode and having a Ti concentration being higher than the Ti concentration in said second sub-layer.

Growth of highly (111) oriented PZT layers can be performed for example by the sol-gel, sputter or CVD deposition techniques. For PZT layers with a Zr/(Zr+Ti) concentration larger than 0.2, crystallinity of the layers formed can be improved by first depositing a thin seedlayer of high Ti PZT. Particularly, seedlayers having a Zr/(Zr+Ti) smaller than 0.2 are formed. Doing so reduces the reactivity of lead or lead oxide, which is not yet incorporated in the PZT layer, towards the underlying electrode layer. This lead or lead oxide would otherwise react with the bottom electrode to form conducting compounds which increase the leakage current of the ferro-electric device. By using the high-Ti PZT seedlayer, ferro-electric layers can be obtained which are single phase perovskite and (111) oriented, featuring abrupt ferro-electric switching, high remnant polarisation and low fatigue rate.

The possibility to grow layers with significantly larger grains than with conventional methods is useful because it allows the fabrication of ferro-electric devices, e.g. ferro-electric capacitors for non-volatile memories, on a single PZT grain or crystal. Such devices have been shown to exhibit superior switching quality, endurance and leakage current compared to devices fabricated on more than one grain as such devices incorporate at least one grain boundary.

The fabrication schemes contained in the respective embodiments are of particular importance in light of the current technological evolution in PZT-based non-volatile memories. In FIGS. (9a–9c) the evolution in cell layout with increasing circuit density is sketched. In the case of the low density, planar cell layout (FIG. 9a), the use of a template layer, such as Pt, to induce the required orientation in the PZT does not result in added process complexity. Meanwhile, in the case of the planar stacked cell, FIG. 9b, which is required for medium density circuits, the bottom electrode should also serve as diffusion barrier to prevent oxidation of the plug material (resulting in loss of its conductive properties) during crystallisation of the ferro-electric. For this purpose, Pt is not suited because of its poor diffusion barrier properties for oxygen. Template layers, used to induce the required orientation in the PZT, represent a process complication while not necessarily improving the barrier properties of the stack. For this case, the proposed fabrication scheme, employing a nano-crystalline or granular bottom electrode, provides a solution requiring a minimum number of layers, at the same time ensuring that the desired texture in the ferro-electric is achieved and effectively preventing oxygen from reaching the plug material. Hence the granular conductive oxide can be grown on top of the plug material (or alternately a supplemental barrier layer may be interposed). Its granular structure guarantees that the desired (111) PZT texture is obtained without the need to control the texture in the plug material/barrier layer/bottom electrode stack.

For circuit densities of 1 Gb and greater, stacked cell layouts with 3D capacitors (FIG. 9c) are necessary, because the need to maintain adequate signal intensity during readout of the cell implies that the remanent polarisation per unit area has to be increased. Three dimensional capacitors are only effective if the ferro-electric maintains the desired orientation with respect to the electrical field lines both on the horizontal electrode surface and electrode sidewalls. Because the field lines run approximately normal to the electrode surface, this implies that the ferro-electric should maintain a fixed orientation with respect to the surface normal on both the horizontal electrode surface and the electrode sidewalls. Since for a columnar electrode, the crystal facets exposed on the sidewall and top surface are necessarily different, this type of electrode structure would inevitably lead to non-optimal orientation and hence low signal contribution from either the top surface or the sidewalls. Meanwhile, the use of a granular bottom electrode will guarantee that the same orientation between the ferro-electric and the electrode surface is maintained at all times. By using this approach, the aim of the 3D capacitor, namely to increase signal strength/unit area, can be fully achieved.

Best Mode

Silicon wafers with a thermal oxide layer are used as substrate for the growth of ferro-electric capacitor (FECAP) structures. After deposition of 10 nm Ti followed by 150 nm Pt by Rf sputtering, the wafers are annealed by rapid thermal processing (RTA) at 700° C. for 5 min. to stabilize the reactive PT/Ti stack. Subsequent $RuO_2$ deposition is performed by reactive DC sputtering in an $O_2/Ar$ mixture. To prevent the deposition of partially oxidized films which are not stable during later thermal process steps, a low sputter power (100W) and an oxygen rich sputter ambient (80% $O_2$ in Ar) are employed. Gas flows are adjusted so that a gas pressure of $8 \times 10^{-3}$ mbar is obtained prior to sputtering. Substrate temperatures for bottom electrode sputtering are varied between 150 and 350° C. The samples are placed on a ceramic support wafer, which is heated from below with a radiative heating element. The temperature is controlled using a thermocouple positioned close to the bottom side of the support wafer.

Thin films of ferro-electric $Pb(Zr,Ti)O_3$ are deposited by spin coating of an alkoxide-type sol-gel precursor using buthoxyethanol as solvent. To compensate for Pb evaporation during thermal treatment, a Pb excess of 15% with respect to the stoichiometric amount is added. Four sub-layers, each approximately 65 nm thick are deposited, with separate drying and pyrolysis steps carried out after each layer on temperature controlled hot plates. Drying is performed at 200° C. for 2 min., pyrolysis at 400° C. for 2 min. To increase the nucleation rate and improve the crystallinity of the layers a lower Zr/Ti concentration (20/80) is used for the first sub-layer than for the next three sub-layers (Zr/Ri+ 30/70). Finally, the layers are crystallised by RTA for 5 min. at 700° C. in $O_2$. A 20° C./s ramp rate was used.

$RuO_2$ top electrodes are deposited by reactive sputtering, using the same pressure and $Ar/O_2$ mixing ratio as used for the bottom electrode sputtering process. No intentional substrate heating is used during the deposition of the top electrodes. Large area (0.0028 $cm^2$) top electrodes were deposited using a shadow mask while smaller size (2000 $m^2$) capacitors were patterned using conventional photoresist photolithography and dry etching.

What is claimed is:

1. A ferro-electric capacitor comprising:
   a first electrode;
   a second electrode being isolated from said first electrode,
   a ferro-electric PZT layer being sandwiched between said first electrode and said second electrode; and
   wherein said first electrode comprises at least a layer of a conductive oxide having at least two sub-layers of individual grains, the top sub-layer having a random orientation of individual grains, the grain size of said conductive oxide layer being at most 20 nm.

2. The ferro-electric capacitor of claim 1, wherein said PZT layer has a predetermined orientation.

3. The ferro-electric capacitor of claim 1, wherein said conductive oxide layer is made of a unary oxide, preferably having a rutile crystal structure such as $IrO_2$, $RuO_2$, $RhO_2$, $ReO_2$, or $OsO_2$.

4. The ferro-electric capacitor of claim 1, wherein said conductive oxide layer is made of a complex oxide having a perovskite crystal layer such as $(La,Sr)CoO_3$.

5. The ferro-electric capacitor of claim 1, wherein said PZT layer comprises a first PZT sub-layer and a second PZT sub-layer, a Ti-concentration of the first PZT sub-layer being higher than a Ti-concentration of the second PZT sub-layer.

6. The ferro-electric capacitor of claim 1, wherein said PZT layer has the form of one horizontal surface with sidewalls overlapping said first electrode.

7. The ferro-electric capacitor of claim 1, being connected to an electrode or an active device through a via connection.

8. The device comprising an active device and a MOSFET on which are deposited at least a contact layer, a conductive via connection and a ferro-electric capacitor according to claim 1.

9. A method of fabricating a ferro-electric capacitor of claim 1, comprising:
   creating on a substrate a first electrode consisting essentially in a layer of a conductive oxide;
   forming a ferro-electric PZT layer on said conductive oxide layer;
   creating a second electrode isolated from said first electrode on the top of the ferro-electric PZT layer;

wherein said conductive oxide layer comprises at least two sub-layers of individual grains, the top sub-layer having a random orientation of individual grains, the grain size of the conductive oxide layer being at most 20 nm.

10. The method of claim 9, wherein the step of forming a ferro-electric PZT layer consists in:

deposition of an amorphous PZT layer; and crystallization of said amorphous layer into a ferro-electric PZT layer by a thermal treatment.

11. The method of claim 9, further comprising, before creating the first electrode:

depositing a contact layer on an active device; and depositing a conductive via connection on said contact layer.

12. The method of claim 9, wherein the temperature of the substrate during the growing of the PZT layer is comprised between a first predetermined temperature Tc1 and a second predetermined temperature Tc2, Tc1 being defined by the temperature below which the sub-layers of the conductive oxide layer being amorphous, Tc2 being defined by the temperature which ensures that the grain size of the PZT layer does not exceed a predetermined dimension on the order of 20 nn.

13. The method of claim 9, wherein the atmosphere during the growing of the PZT layer is a $O_2$/Ar mixing atmosphere having a ratio above 1 and preferably above 4/1.

14. The method of claim 9, wherein the deposition rate of the PZT layer during the growth is comprised in a range 15–20 nm/min.

15. The method of claim 9, wherein said conductive oxide layer has a grain size at least two times and preferably five times smaller than the PZT layer thickness.

* * * * *